(12) United States Patent
Sotiriou et al.

(10) Patent No.: US 7,870,516 B2
(45) Date of Patent: Jan. 11, 2011

(54) ASYNCHRONOUS, MULTI-RAIL, ASYMMETRIC-PHASE, STATIC DIGITAL LOGIC WITH COMPLETION DETECTION AND METHOD FOR DESIGNING THE SAME

(75) Inventors: Christos P. Sotiriou, Crete (GR); Alex Kondratyev, Campbell, CA (US); Jordi Cortadella, Barcelona (ES); Luciano Lavagno, Berkeley, CA (US)

(73) Assignee: Institute of Computer Science, Foundation for Research and Technology- Hellas, Crete (GR)

( * ) Notice: Subject to any disclaimer, the term of this patent is extended or adjusted under 35 U.S.C. 154(b) by 289 days.

(21) Appl. No.: 11/976,522

(22) Filed: Oct. 25, 2007
(Under 37 CFR 1.47)

(65) Prior Publication Data
US 2009/0183126 A1 Jul. 16, 2009

Related U.S. Application Data

(63) Continuation of application No. 11/283,070, filed on Nov. 21, 2005, now abandoned.

(60) Provisional application No. 60/642,990, filed on Jan. 12, 2005.

(51) Int. Cl.
*G06F 17/50* (2006.01)
(52) U.S. Cl. .............................. 716/3; 716/1
(58) Field of Classification Search .............. 716/1–3
See application file for complete search history.

(56) References Cited

U.S. PATENT DOCUMENTS

| | | | |
|---|---|---|---|
| 4,686,392 A | 8/1987 | Lo | |
| 5,250,856 A | 10/1993 | Burton et al. | |
| 5,305,463 A | 4/1994 | Fant et al. | |
| 5,526,514 A * | 6/1996 | Pradhan et al. | 716/3 |
| 5,845,109 A | 12/1998 | Suzuki et al. | |
| 6,043,674 A | 3/2000 | Sobelman | |
| 6,075,389 A | 6/2000 | Umemoto et al. | |
| 6,088,830 A | 7/2000 | Blomgren et al. | |
| 6,133,761 A | 10/2000 | Matsubara | |
| 6,509,761 B2 | 1/2003 | Taki | |
| 6,526,542 B2 | 2/2003 | Kondratyet | |
| 6,807,509 B2 | 10/2004 | Bourdin et al. | |
| 6,819,150 B1 | 11/2004 | Santosa et al. | |
| 6,891,410 B2 | 5/2005 | Sadowski | |
| 6,964,003 B2 | 11/2005 | Thiebeault | |

(Continued)

OTHER PUBLICATIONS

I. Blunno, J. Cortadella, A. Kondratyev, L. Lavagno, K. Lwin, and C. Sotiriou. Handshake Protocols for De-Synchronization. In *Proc. International Symposium on Advanced Research in Asynchronous Circuits and Systems*, pp. 149-158, IEEE Computer Society Press, Apr. 2004.

(Continued)

*Primary Examiner*—Paul Dinh
(74) *Attorney, Agent, or Firm*—Steptoe & Johnson LLP

(57) ABSTRACT

A method of converting a Boolean logic circuit into an asynchronous multi-rail circuit is provided. A Boolean logic circuit is converted into a first multi-rail circuit using at least Shannon's expansion. The first multi-rail circuit is technology mapped into a second multi-rail circuit. Completion detection circuitry is added which receives the primary outputs of the second multi-rail circuit.

11 Claims, 7 Drawing Sheets

ORIGINAL LOGICAL CIRCUIT

EXPANSION INTO 2-RAIL USING TI-APPROACH

U.S. PATENT DOCUMENTS

| | | | | |
|---|---|---|---|---|
| 2002/0178432 | A1* | 11/2002 | Kim et al. | 716/18 |
| 2002/0188912 | A1* | 12/2002 | Kondratyev | 716/2 |
| 2004/0019857 | A1* | 1/2004 | Teig et al. | 716/1 |
| 2007/0089082 | A1* | 4/2007 | Liu et al. | 716/16 |

OTHER PUBLICATIONS

User Guide. In *Celtic User Manual, Cadence Design Systems, Inc.*, 2004.

D. Chinnery and K. Keutzer. Reducing the Timing Overhead. In *Closing the Gap between ASIC and Custom*: Tools and Techniques for High-Performance ASIC Design, chapter 3. Kluwer Academic Publishers, 2002.

J. Cortadella, A. Kondratyev, L. Lavagno, and C. Sotiriou. Coping with the Variability of Combinational Logic Delays. In *Proc. International Conf. Computer Design (ICCD)*, Oct. 2004.

S. Devadas and K. Keutzer. Synthesis of Robust Delay-Fault Testable Circuits: Theory. *IEEE Transactions on Computer-Aided Design*, 11(I):87-101, Jan. 1992.

Y. Kukimoto, R.K. Brayton, and P. Sawkar. Delay-Optimal Technology Mapping by DAG Covering. In *Design Automation Conference*, pp. 348-351, 1998.

Alex Kondratyev and Kelvin Lwin. Design of Asynchronous Circuits by Synchronous CAD Tools. In *Proc. ACM/IEEE Design Automation Conference*, Jun. 2002.

D. S. Kung. Hazard-Non-Increasing Gate-Level Optimization Algorithms. In *Proc. International Conf. Computer-Aided Design (ICCAD)*, pp. 631-634, 1992.

E. Lehman, Y. Watanabe, J. Grodstein, and H. Harkness. Logic Decomposition During Technology Mapping. *IEEE Transactions on Computer-Aided Design*, 16(8):813-834, Aug. 1997.

S.R Nassif. Modeling and Forecasting of Manufacturing Variations, Proceedings of the ASP-DAC 2001 *Asia and South Pacific Design Automation Conference*, Jan. 30-Feb. 2, 2001, pp. 145-149.

R. Puri, A. Bjorksten, and T. Rosser. Logic Optimization by Output Phase Assignment in Dynamic Logic Synthesis. In *Proc. International Conf. Computer-Aided Design (ICCAD)*, pp. 2-8, 1996.

M. Prasad, D. Kirkpatrick, R.Brayton, and A. Sangiovanni Vincentelli. Domino. Logic Synthesis and Technology Mapping. In *Proc. International Workshop on Logic Synthesis*, vol. 1, 1997.

Jens Sparsø and Jørgen Staunstrup. Delay-Insensitive Multi-Ring Structures. *Integration, the VLSI journal*, 15(3):313-340, Oct. 1993.

E. M. Sentovich, K. J. Singh, L. Lavagno, C. Moon, R. Murgai, A. Saldanha, H. Savoj, P. R. Stephan, R. K. Brayton, and A. Sangiovanni-Vincentelli. SIS: A System for Sequential Circuit Synthesis. Technical report, U.C. Berkeley, May 1992.

Ivan E. Sutherland. Micropipelines. *Communications of the ACM*, 32(6):720-738, Jun. 1989.

M. A. Thornton, K. Fazel, R. B. Reese, and C. Traver. Generalized Early Evaluation in Self-Timed Circuits. In *Proc. Design, Automation and Test in Europe (DATE)*, pp. 255-259, Mar. 2002.

S. H. Unger. Asynchronous Sequential Switching Circuits. Wiley-Interscience, John Wiley & Sons, Inc., New York, 1969.

Victor I. Varshaysky, editor. *Self-Timed Control of Concurrent Processes*: The Design of Aperiodic Logical Circuits in Computers and Discrete Systems. Kluwer Academic Publishers, Dordrecht, The Netherlands, 1990, Chapters 3 and 4.

R. K. Brayton et al, Multilevel Logic Synthesis, Proceedings of the IEEE, vol. 78, No. 2, Feb. 1990.

* cited by examiner

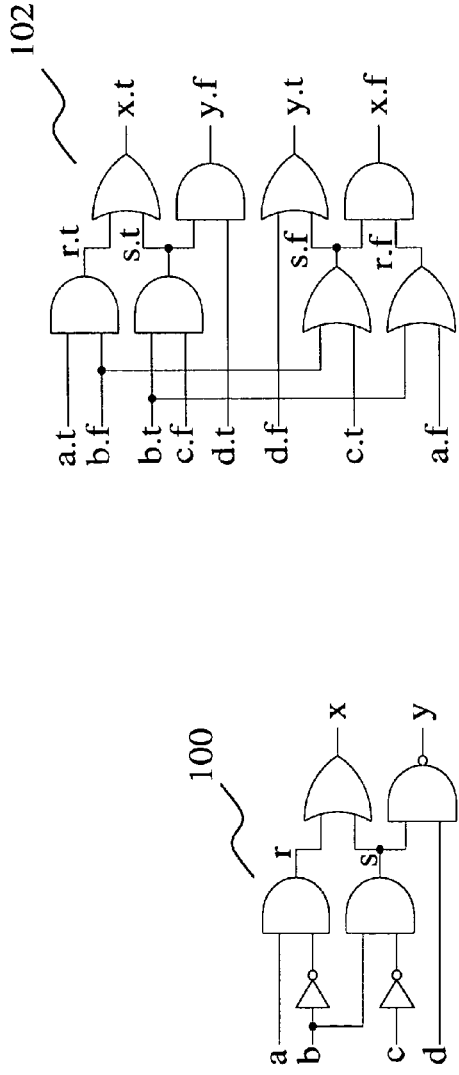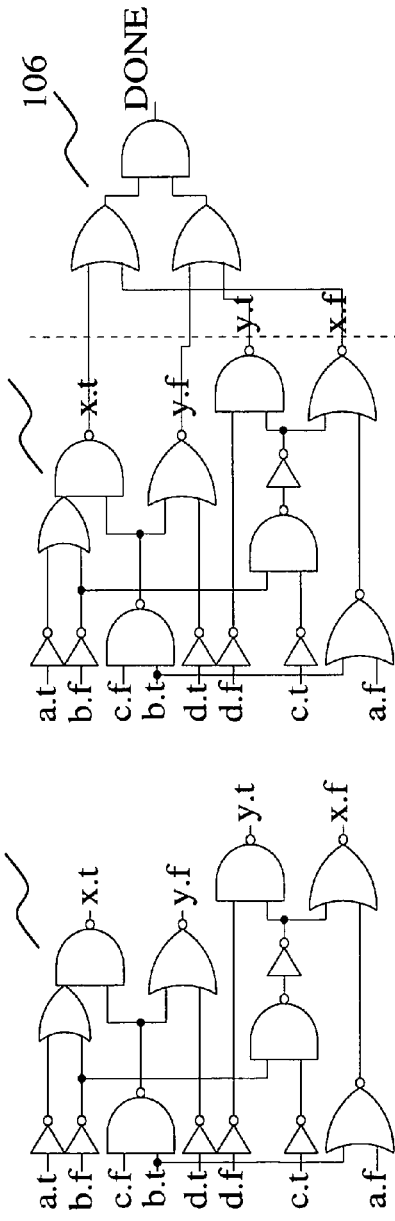
ORIGINAL LOGICAL CIRCUIT
Fig. 1 (a)
EXPANSION INTO 2-RAIL USING TI-APPROACH
Fig. 1 (b)
AFTER TECHNOLOGY MAPPING
Fig. 1 (c)
WITH COMPLETION DETECTION
Fig. 1 (d)

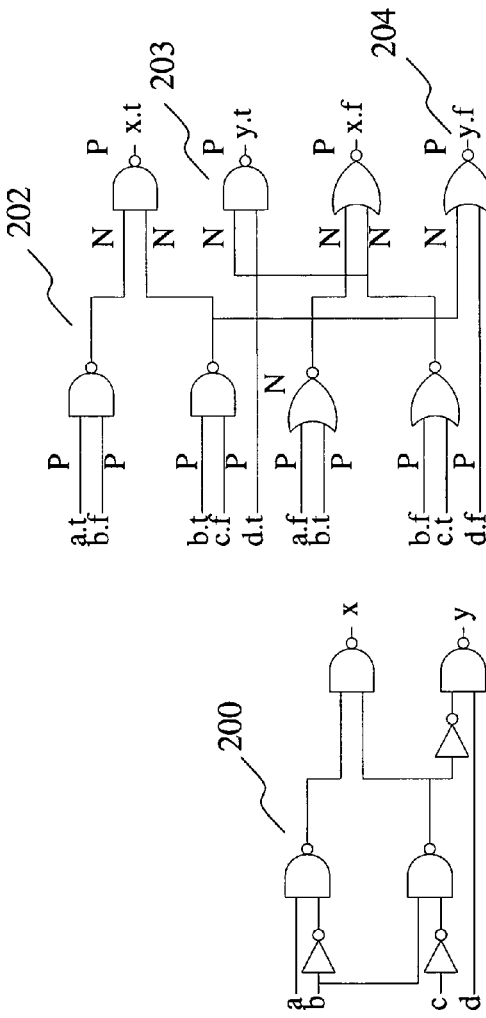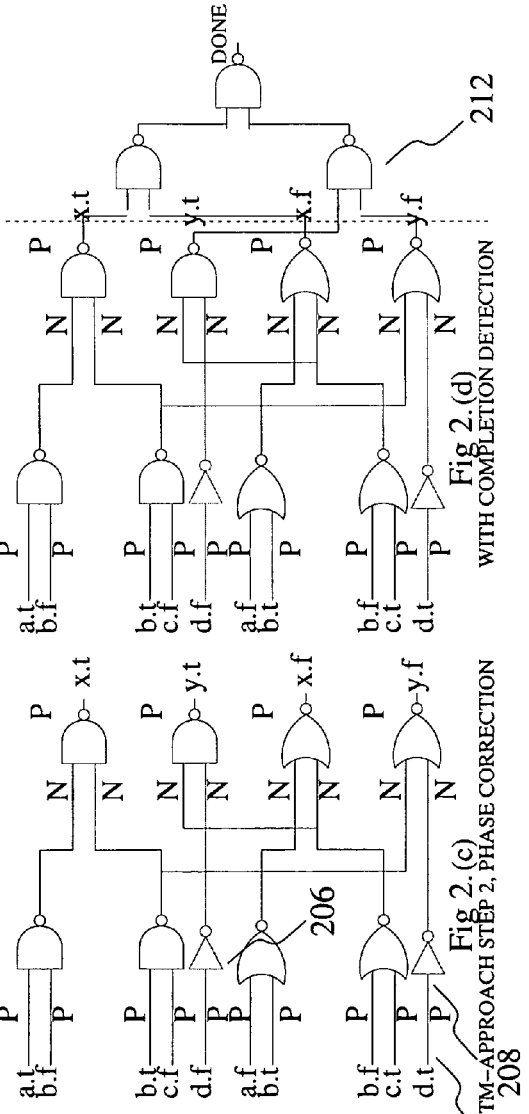

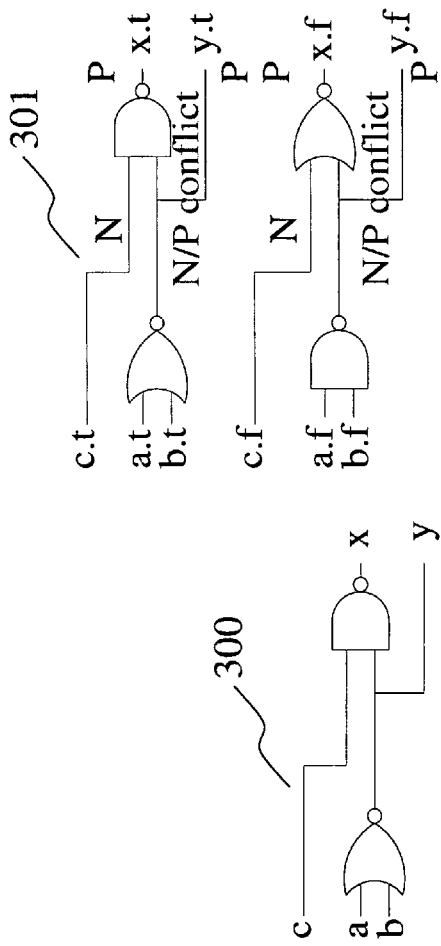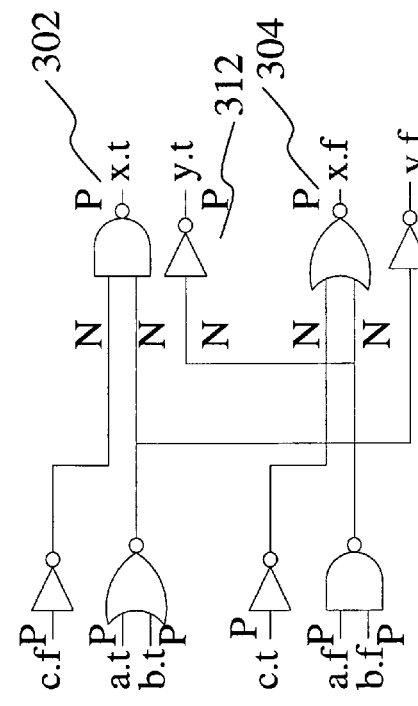
Fig. 3 (a)
ORIGINAL TECH-MAPPED CIRCUIT
Fig. 3 (b)
TM-APPROACH STEP 1
Fig. 3 (c)
TM-APPROACH, STEP 2, PHASE CORRECTION

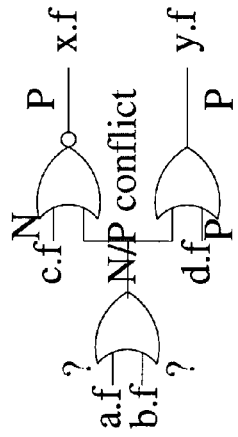
Fig. 4 (a)
ORIGINAL TECH-MAPPED CIRCUIT
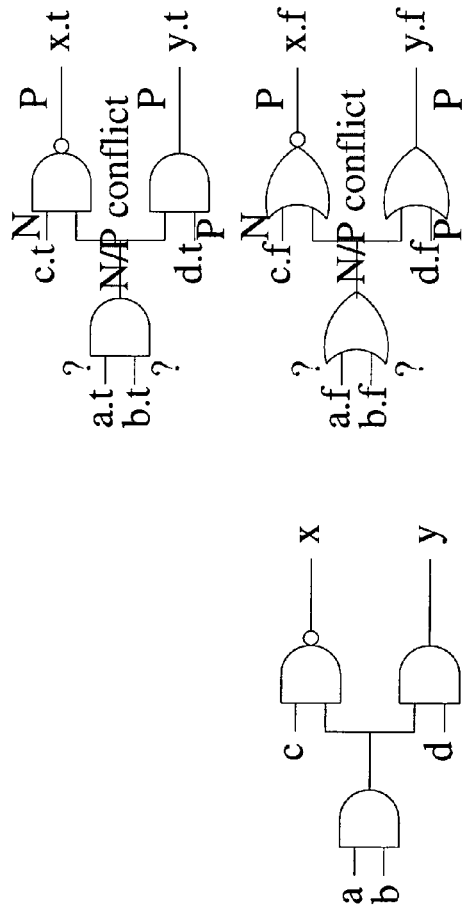
Fig. 4 (b)
TM-APPROACH STEP 1
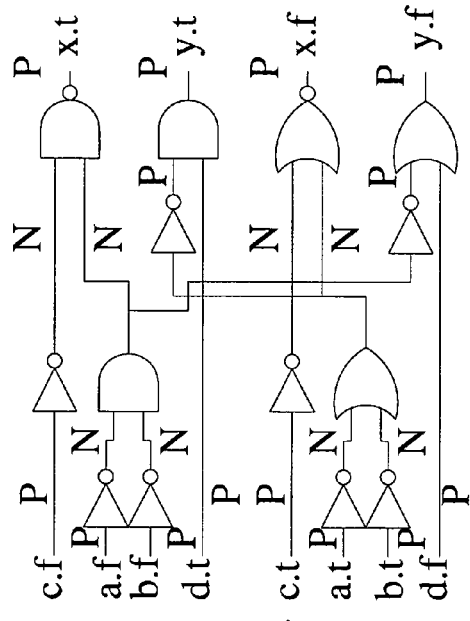
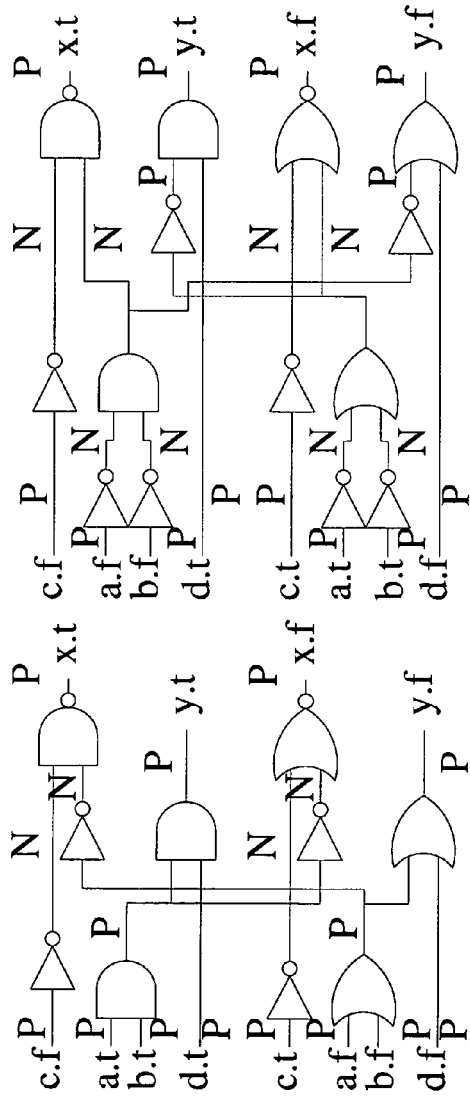
Fig. 4 (c)
TM-APPROACH, STEP 2, PHASE CORRECTION 1
Fig. 4 (d)
TM-APPROACH, STEP 2, PHASE CORRECTION 2

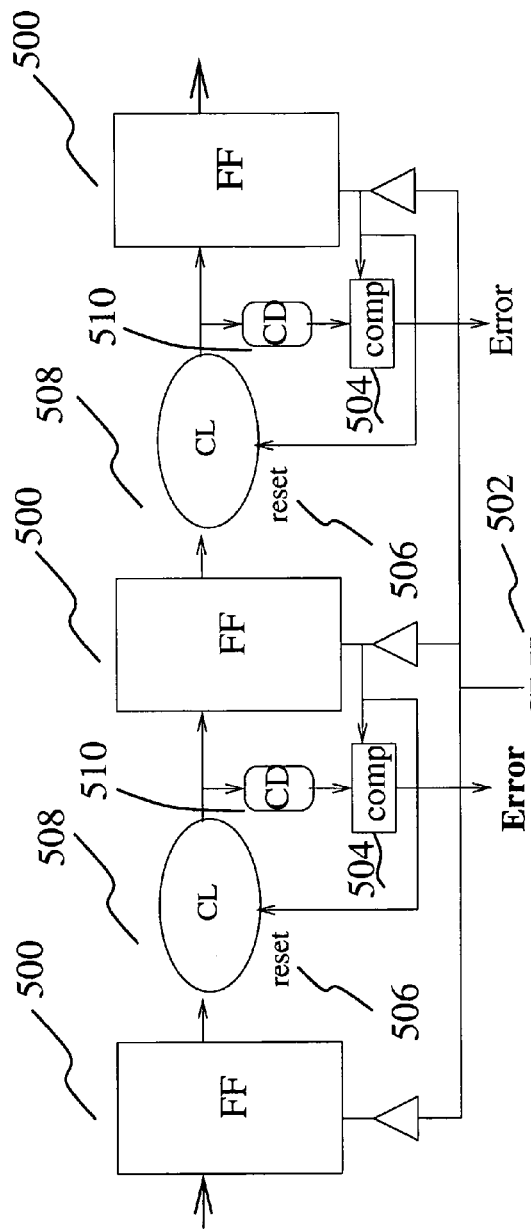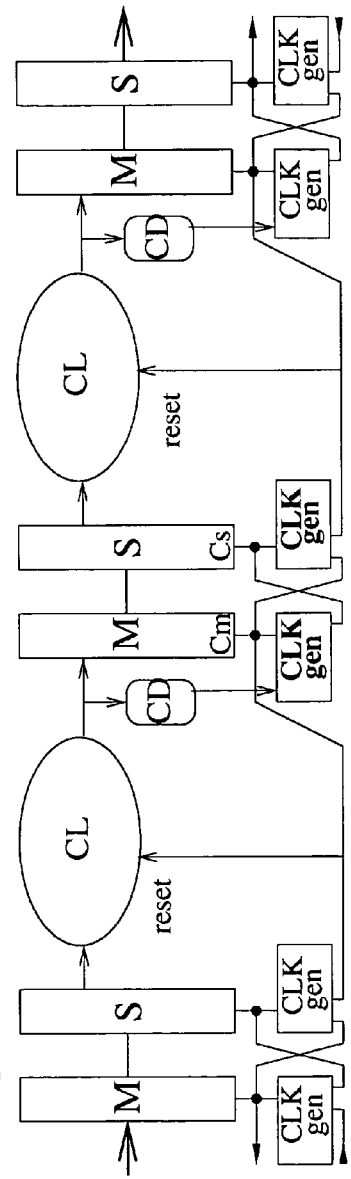
Fig. 5 (a) SYNCHRONOUS, GLOBAL CLOCK OPERATION
Fig. 5 (b) LOCALLY GENERATED CLOCK OPERATION

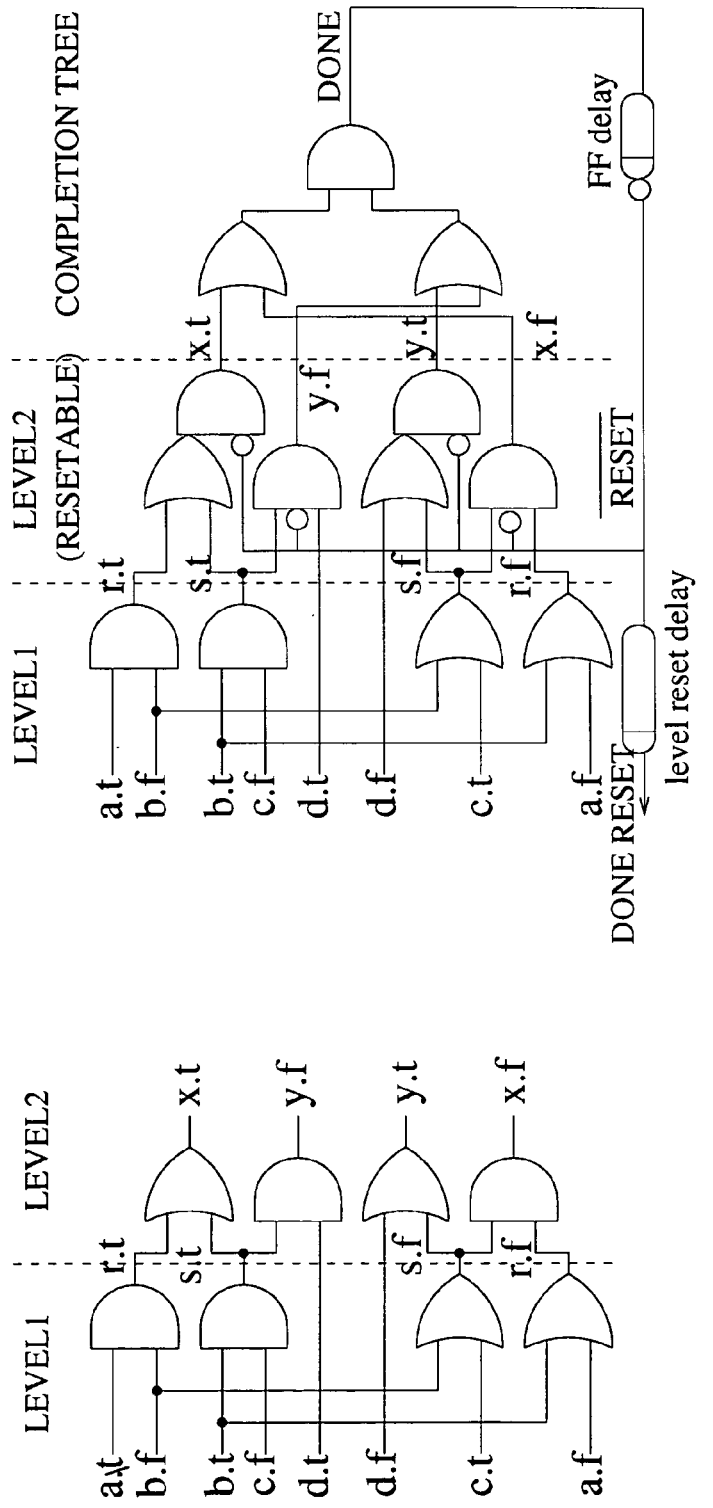
Fig. 7(a) 2-LEVEL, ORIGINAL 2-RAIL CIRCUIT
Fig. 7(b) FAST RESET INTRODUCED AT LEVEL 2 AND COMPLETION

ASYNCHRONOUS, MULTI-RAIL, ASYMMETRIC-PHASE, STATIC DIGITAL LOGIC WITH COMPLETION DETECTION AND METHOD FOR DESIGNING THE SAME

CROSS-REFERENCE TO RELATED APPLICATIONS

The present application is a continuation of and claims priority to U.S. patent application Ser. No. 11/283,070 filed on Nov. 21, 2005, which itself claims priority to U.S. Patent Application Ser. No. 60/642,990, filed on Jan. 12, 2005, the disclosure of which is expressly incorporated by reference herein in its entirety.

BACKGROUND OF THE INVENTION

1. Field of the Invention

The present invention is directed to an asynchronous circuit with completion detection, and a system and method for designing the same. In particular, the invention is directed to translation of a Boolean single-rail combinational logic circuit to a multi-rail circuit with completion detection.

2. Discussion of Background Information

Asynchronous circuits are sequential digital circuits that are able to operate without clock signals. Two asynchronous logic paradigms are disclosed in U.S. Pat. No. 6,526,542 ("Multi-Rail Asynchronous Flow with Completion Detection and System and Method for Designing the Same") and in U.S. Pat. No. 5,305,463 ("Null convention logic system").

Multi-rail asynchronous circuits encode data and spacer values using 2 or more signal rails. In such encodings the data value represents actual binary data fed to the circuit, for example, a TRUE or a FALSE value, whereas the spacer value is used to appropriately initialize the circuit to prepare it for accepting the next data value. Multi-rail asynchronous circuits operate in 2 phases, always alternating between data and spacer values, irrespective of the encoding used for data and spacers. The first phase is the phase where data values are applied at circuit inputs and data values will appear at the circuit outputs, whereas the second phase triggered by the completion of the first applies spacer values at circuit inputs and completes when spacer values have propagated to the outputs and the spacer value is assigned to every internal net. In all approaches in the literature these phases are symmetrical, i.e. both phases operate by feeding the value (data or spacer) at the circuit inputs and waiting for that value to propagate through the circuit to the outputs, thus their delay is almost identical.

The most common encoding type in asynchronous multi-rail logic is dual-rail encoding. In dual-rail encoding, a digital signal is represented by 2 binary rails, which assume a total of four states, (0, 0), (0, 1), (1, 0) and (1, 1). The (0, 0) value commonly represents the spacer word, the (0, 1) value represents the TRUE data value, where as the (1, 0) value represents the FALSE data value. Value (1, 1) is commonly unused. In other multi-rail encodings data words can assume more than 2 logic values.

A reason for encoding digital signals in multi-rail representations is to enable the detection of the propagation of data values from the circuit inputs to the circuit outputs and by incorporating a completion mechanism to detect that the operation of the circuit has completed. Circuits designed using multi-rail representations can thus exhibit asynchronous, data-dependent input to output delays. These type of circuits can increase the performance of digital by stems by replacing the conventional synchronous circuits, the operation of which is based on an external timing reference, instead of completion detection.

Detecting completion requires a specific mechanism to be added to the multi-rail circuit, the operation of which depends on the circuit implementation of the multi-rail logic. Two classes of completion schemes are "strongly-indicating" and "weakly-indicating." "Strongly-indicating" circuits will only propagate data values at the outputs after all internal nodes have settled to their final value. "Weakly-indicating" circuits may propagate data values at the outputs even if some of the internal nodes have not yet assumed their final values. Spacer values are propagated in both types identically, from the inputs to the outputs setting every internal signal to spacer, i.e. (0, 0).

The majority of digital designs are today implemented using synchronous techniques, requiring the presence of external clock signals. The key advantage of asynchronous circuits with completion detection is the possibility to exploit data-dependent, true, input to output delay indicated by the circuit itself. These type of circuits have the potential for increasing performance and are immune to parametric and environmental variations, such as temperature variations, power supply voltage fluctuations and variability in fabrication characteristics of on-chip devices.

At present, even though a set of methodologies exist for implementing asynchronous multi-rail circuits with completion detection, all approaches in the literature require significant amount of area increase (over 2.5×), and every circuit operation requires two phases of almost equal delay, potentially doubling (2×) the circuit delay.

Several methodologies exist in the literature for the implementation of multi-rail circuits with completion detection. In dynamic CMOS logic approaches such as the paradigm disclosed in U.S. Pat. No. 4,686,392 ("Multi-functional Differential Cascade Voltage Switch logic") are used, along with dynamic precharge for this purpose. However, the preferred embodiment is targeted to design automation, and focuses on static CMOS circuitry.

In static CMOS design, the literature provides three approaches to the design of multi-rail circuits with completion detection: DIMS (Delay-Insensitive Minterm Synthesis). NCL (Null Convention Logic—U.S. Pat. No. 5,305,463) and extended NCL or NCLX (U.S. Pat. No. 6,526,542). All three approaches employ symmetric data and spacer phases, but employ different implementation styles.

The DIMS approach is a "strongly-indicated" approach based on C-Muller gates (sequential asynchronous gates implementing the function c=ab+bc+ac), which implements a symmetric two-phase, dual-rail circuit by transforming every output node of a Boolean circuit, f, into two logic cones, f.t, the data TRUE output and f.f, the data FALSE output. In DIMS the two logic cones are implemented in a sum-of-minterm fashion (or of minterms), where each minterm is realized as a C-Muller gate, according to the truth table of the implemented dual-rail function. In DIMS logic when a data word arrives at the input, only one minterm, i.e. one C-Muller gate, is activated thus only one of 2 rails per output is asserted. The assertion of one of the two rails of each output signals completion for that output. The advantage of this approach is its simplicity, since each output has only one active circuit path. The disadvantages include the use of non standard-cell gates (C-Muller) and the lack of application of logic optimization to DIMS circuits, which implies very large circuit area (from ×4, ×6 to very large).

The NCL approach is a "strongly-indicated" approach based on TH (Threshold) gates, a special-purpose static CMOS gate family and library, implementing "threshold" functions, where each gate in the NCL library has a corresponding dual gate implementing its "dual" function. In NCL flow, each gate has the same p-type pull-up network, comprised of all dual-rail inputs. Thus, all NCL gate outputs output a spacer word (all NCL gates contain an inverting keeper), when all inputs assume the spacer value. In NCL, the "dual" of a gate is a gate which outputs the inverted value of another. In NCL, the data TRUE rail of each logic output is generated by mapping the Boolean function to the TH gates, whereas the data FALSE rail is generated by transforming each TH gate of the data TRUE rail to its dual TH gate. The approach requires again a special purpose CMOS standard-cell library and has been shown to require very large area, same as DIMS.

In contrast to the other two approaches, the NCLX approach (NCL with explicit completion) is better suited to design automation and is based on standard-cell CMOS gates only. NCLX creates a dual-rail network, based on an original Boolean network, by adding duals to every gate in the original circuit using De' Morgan's duality principle and by eliminating inverted circuit nets by replacing them with the corresponding complementary rails. De' Morgan's duality principle states: inverted conjunction of n inputs is equal to the disjunction of their inverses and similarly the inverted disjunction of n inputs is equal to the conjunction of their inverses. Completion in NCLX is implemented by inserting local completion detectors (OR gates) at every circuit node and implementing a "guarded" conjunction gate (C element, which is equivalent to an AND gate with memory). The "guarded" conjunction gate outputs a single completion signal based on the conjunction of all internal nets. The completion detection output can thus only be asserted when all internal nodes have settled to their final value. NCLX requires symmetric phases of equivalent delay for data and spacers.

SUMMARY OF THE INVENTION

The present invention addresses the drawbacks of prior art in the area of multi-rail circuit implementation.

According to an embodiment of the invention, a method of convening a Boolean logic circuit into an asynchronous multi-rail circuit is provided. A Boolean logic circuit is converted into a first multi-rail circuit using at least Shannon's expansion. The first multi-rail circuit is technology mapped into a second multi-rail circuit. Completion detection circuitry is added which receives the primary outputs of the second multi-rail circuit.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIGS. 1(a)-1(d) illustrate an example according to a preferred embodiment of the conversion of a boolean logic circuit to a dual-rail circuit with completeness detection using Shannon's expansion.

FIGS. 2(a)-2(d) illustrate an example according to another preferred embodiment of the conversion of a boolean logic circuit to a dual-rail circuit with completeness detection using technology mapping.

FIGS. 3(a)-(c) and 4(a)-(d) illustrate examples of conversion of a boolean logic circuit to a dual-rail circuit with completeness detection using technology mapping when inconsistencies are detected during the processing.

FIGS. 5(a) and 5(b) illustrate examples of integrating a dual-rail circuit with completeness detection into a synchronous or asynchronous environment.

FIGS. 7(a) and (b) illustrates an example of a circuit with completeness detection sliced into two with fast reset circuitry added to the second slice.

DETAILED DESCRIPTION OF THE EXEMPLARY EMBODIMENT

Figure 6:
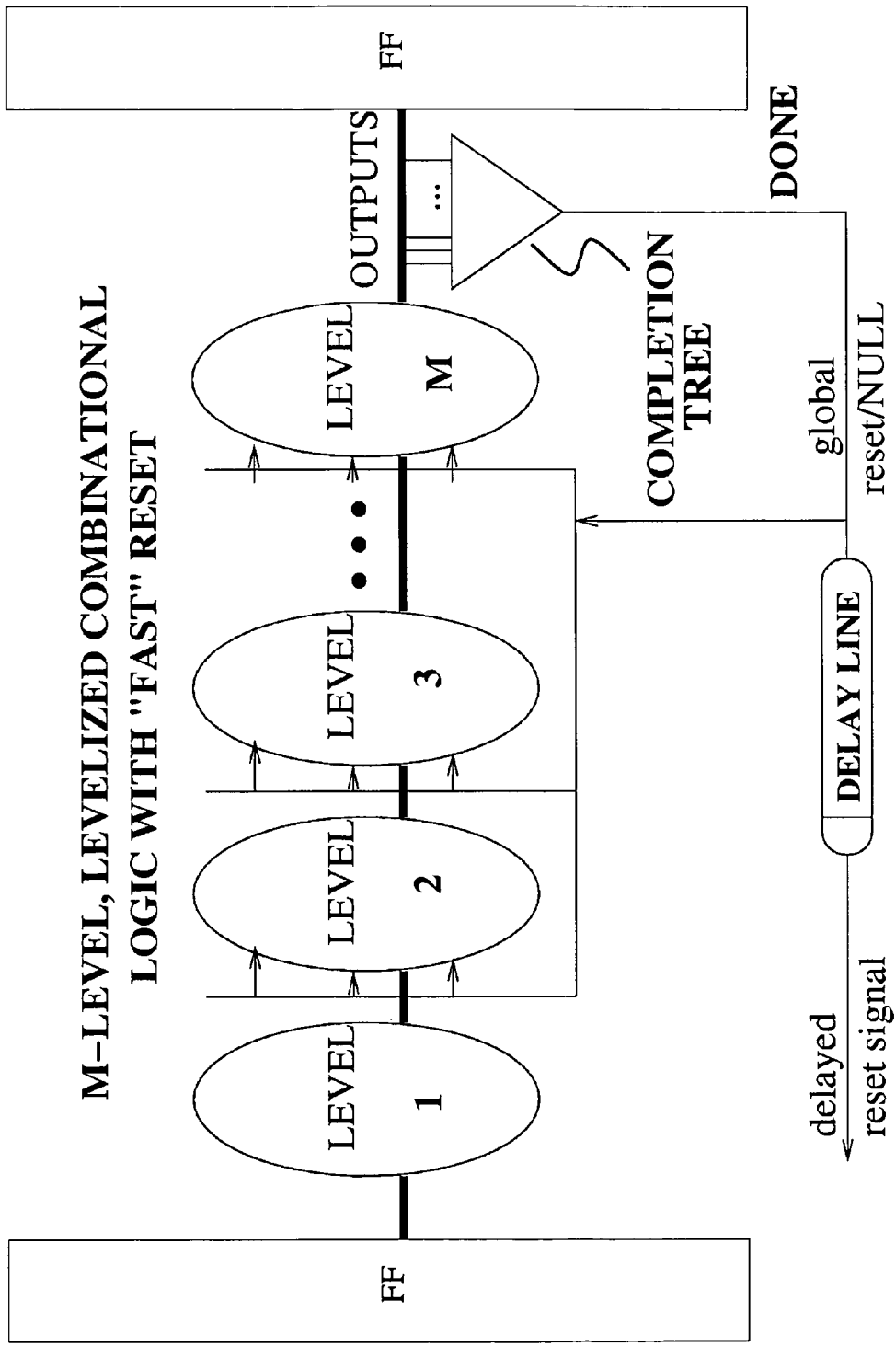
FIG. 6 illustrates separating a dual-rail circuit with completeness detection into slices for the addition of fast reset circuitry.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

The present invention provides a flow that combines performance advantages with the robustness and simplicity achieved by preferably using any static standard-cell CMOS logic family and a standard ASIC design flow. The invention enables ASIC designers to easily measure exactly when a combinational circuit is done computing. In practical terms, the circuits provide that without almost any timing overhead and with some area overhead, every combinational logic block has an additional completion detection output that rises a few gate delays after the last primary output has settled.

A plurality of gates with the presence of primary inputs and primary outputs and without cycles constitutes a Boolean network. A Boolean network is monotonic if every circuit node in the network can be assigned a positive or a negative phase. The phase property reflects the direction in which the output signal of a gate will change due to a change in the primary input signals. It is known, by an existing proof, to those skilled in the art, that a monotonic Boolean network is hazard-tree under monotonic input transitions. The invention can transform a non-monotonic, single-rail Boolean network to a monotonic, multi-rail Boolean network. Two transformation embodiments are described herein.

According to a first preferred embodiment, a transformation algorithm will generate a positive monotonic Boolean network from a set of Boolean logic equations. Given a Boolean equation describing at the logical level a Boolean network, every input signal present, for example an input with name x, in the equation is used to create two primary inputs for the dual-rail circuit, for example, input x will create the two inputs $x^t$ and $x^f$. These two new inputs created for every input signal of the original Boolean logic will in the dual-rail circuit represent the TRUE (0, 1) and FALSE (1, 0) evaluations of signal x when data is transmitted. Value (0, 0) will represent the spacer or NULL word, used to clear every node in the circuit in preparation for the next data word. Each node implementing a function $y_i = f_i(x_1, \ldots, x_n)$, creates two nodes in the dual-rail circuit with functions:

$$y_i^t = DR(f_i(x_1, \ldots, x_n))$$

$$y_i^f = DR(\overline{f}_i(x_1, \ldots, x_n))$$

where "DR" denotes the transformation of the function into positive unate, changing the input signals of function $f_i$ from $x_i$ to $x^{t;i}$ and $x^{f;i}$ as appropriate. A Boolean function is unate with respect to a variable x if both that signal and its inverse are not present in the expression of the function. The transformation DR is a recursive application of Shannon's expansion, as shown below;

$$DR(0)=1) \cdot DR(1)=1$$

$$DR(x \times f_x + \overline{x} \times f_{\overline{x}}) = x^1 \times DR(f_x) + x^f \times DR(f_{\overline{x}})$$

and any inversions of the form ($y=\overline{x}$) are removed and converted into wires ($y^t \, x^f$ and $y^f x^t$).

By way of non-limiting example, a circuit described by the Boolean expression:

$$y = a\overline{b} + b(c + \overline{d})$$

would be converted as follows.

The initial step is to create dual-rail primary inputs. The original inputs of the circuit are a, b, c, and d, such that the dual-rail circuit will have inputs a.t, a.f, b.t, b.f, c.t, c.f, d.t and d.f. Similarly the dual-rail circuit will have a single dual-rail output consisting of two signals y.t and y.f. For each output signal of the dual-rail circuit the DR function is defined and expanded. The equation initially is:

$$y^t = DR(a\overline{b} + b(c + \overline{d}))$$

$$y^f = DR(\overline{a\overline{b} + b(c + \overline{d})})$$

The functions of dual-rail signals $y^t$ and $y^f$ are expanded based on the recursive definition of DR and derive the dual-rail circuit. Below is the recursive expansion of DR for function $y^t$.

| | |
|---|---|
| $y^t = DR(a\overline{b} + b(c + \overline{d}))$, | initially |
| $y^t = a^t \cdot DR(\overline{b} + b(c + \overline{d})) + a^f \cdot DR(b(c + \overline{d}))$ | step 1, expand a |
| $y^t = a^t \cdot DR(\overline{b} + (c + \overline{d})) + a^f \cdot DR(b(c + \overline{d}))$ | simplify |
| $y^t = a^t \cdot (b^f \cdot DR(c + \overline{d}) + b^t \cdot DR(1)) + a^f \cdot$ $(b^t \cdot DR(c + \overline{d}) + b^f \cdot DR(0))$ | step 2, expand b |
| $y^t = a^t \cdot b^f + b^t \cdot DR(c + \overline{d})$ | simplify |
| $y^t = a^t \cdot b^f + b^t \cdot (c^t \cdot DR(1) + c^f \cdot DR(\overline{d}))$ | step 3, expand c |
| $y^t = a^t \cdot b^f + b^t \cdot (c^t + DR(\overline{d}))$ | simplify |
| $y^t = a^t \cdot b^f + b^t \cdot (c^t + d^f)$ | step 4, expand d |

The DR is expanded, as specified above, for every literal of the original function. The other rail signal. $y^f$, is expanded similarly. The original function $y=a\overline{b}-b(c+\overline{d})$ would eventually be converted into:

$$y^t = DR(a\overline{b} + b(c + \overline{d})) = a^t b^f + b^t(c^t + d^f)$$

$$y^f = DR(\overline{(a\overline{b} + b(c + \overline{d}))}) = (a^f + b^t)(b^f + c^f + d^f)$$

A non-limiting example of the above process is shown in FIGS. 1(a)-1(d). FIG. 1(a) shows a boolean logic circuit 100 having the function for x and y as follows:

$$x = a\overline{b} + b\overline{c}$$

$$y = (\overline{b}\overline{c}d)$$

Using recursive Shannon's expansion, the above single-rail circuit 100 is converted into a dual-rail circuit 102 shown in FIG. 1(b), as follows:

$$x^1 = a^1 b^f + b^1 c^1$$

$$x^f = (b^f + c^f)(b^1 + a^f)$$

$$y^t = d^f + (c^f + b^f)$$

$$y^1 = d^f(b^t c^f)$$

The dual-rail circuit is then subject to technology mapping to form the circuit 104 shown in FIG. 1(c). As shown in FIG. 1(c), circuit 104 uses both negative logic and positive logic to implement the dual-rail circuit. This differs from prior null convention techniques, which were limited to the use of positive logic (i.e., the use of positive gates or negative gates followed by inverters). Since gates that implement negative logic are faster than gates used to implement positive logic, the combination of negative and positive logic in the preferred embodiment is faster than prior art dual-rail circuits that were limited to positive logic.

Completion detection circuitry 106 is then added to the primary outputs of circuit 104 as shown in FIG. 1(d). The particular implementation shown in FIG. 1(d) is a logical tree in which each set of companion signals for each primary output is input to an OR gate, and the outputs of the individual OR gates are input to an AND gate that outputs the completion detection signal. An optimized tree could be used with NAND gates. Other completion detection implementations could also be used.

Another embodiment of the invention generates a monotonic Boolean network of various local polarities, mixed positive, negative, depending on the nature of the gates of the original circuit. The process uses a technology-mapped circuit netlist in which all gates used in the circuit are unate and every gate has a corresponding dual gate with respect to DeMorgan's equivalence law. Given a technology-mapped circuit, every input signal present, for example an input with name x, in the equation is used to create two primary inputs for the dual-rail circuit, for example, input x will create the two inputs $x^t$ and $x^f$. In a dual-rail circuit, these two new inputs, created for every input signal of the original Boolean logic, can represent the TRUE (0, 1) and FALSE (1, 0) evaluations of signal x when data is transmitted. Value (0, 0) at the inputs of the circuit will represent the spacer or NULL word, used to clear every node in the circuit in preparation for the next data word. Values (0, 0) and (1, 1) at nodes of the circuit represent the spacer or NULL word depending on the phase of the node; if the node is positive, the spacer or NULL word is (0, 0), whereas if the node is negative, the spacer or NULL word is (1, 1). The polarity of the node depends on the use of negative logic gates in the original circuit.

Each gate in the circuit, producing signal $y_1$ creates two gates, one producing $y_i^f$ from signals $y_i^t, \ldots, y_k^t$ and a dual gate based on DeMorgan's law producing signal $y_i^t$ from signals $y_i^f, \ldots, y_k^f$. Any inversions of the form $y_1 = y_1$ are simply replaced by wires connecting $y_1^t = y_1^f$, and $y_1^t = y_1^t$. Each node in the derived dual-rail circuit is assigned a polarity label, either positive or negative. This label is assigned by traversing the circuit starting from primary outputs, which are positive by default, to the net being labelled, where the traversal of a inverting gate or inverting input switches the polarity of that net. Labelling in the direction of outputs to inputs, in order to perform phase correction at inputs if needed. In case multiple paths of different length reconverge at a node, the label of the longest path is assigned, in order to minimize the circuit slowdown by adding phase-correcting inverters to critical paths. In this labelling method, an inconsistently labelled node is a input which begins in negative phase or a input node of an inverting gate with the same polarity at the output node of that same gate. Inconsistent labelling implies incorrect operation as a monotonic Boolean network, however by incorporating phase correcting inverters, labelling can be fixed. For each gate input or primary input which is inconsistently labelled, insert an inverter connecting it to the dual signal, e.g. an input of gate connected to signal and requiring the opposite phase is connected to $\overline{y_1}^T$ via an inverter which does not change functionality but corrects the phase.

A non-limiting example of the above process is shown in FIGS. 2(a)-2(d). FIG. 2(a) shows a boolean logic circuit 200 which is the same as circuit 100 discussed above. The functionality of circuit 200 is technology-mapped using a library with a netlist in which all gates used in the circuit are unate and every gate has a corresponding dual gate with respect to DeMorgan's equivalence law. United Microelectronics and TSMC Taiwan Semiconductor Manufacturing Company are examples of such libraries. The resulting technology mapped circuit 202 is shown in FIG. 2(a).

Referring now to FIG. 2(b), the state of each of the signals in the circuit is identified beginning with the primary output signals and propagating upstream to the primary outputs. Initially all of the primary outputs are identified as having either a positive or negative state (FIG. 2(b) uses a positive state represented by P). These signals are then tracked back to the gates that generated them. If the gate is a negative logic gate, then the inputs to that gate are designated as the opposite state from the output: in FIG. 2(b), by coincidence all of the primary outputs originate from negative logic gates, such that the inputs to those gates are designated as negative ("N", the opposite state of the positive output). Conversely, if the gate is a positive logic gate, then the inputs to the gate are designated by the same state as the output (this does not arise in the circuit of FIG. 2(b)). The process reiterates upstream until the circuit paths connecting to the primary inputs are designated either positive or negative.

The states of the circuit paths connecting to the primary inputs are compared to the state of the primary outputs. If they are the same, then no circuit modifications are necessary. However, if there are any inconsistencies, then the circuit must be modified to address the same. By way of example, in FIG. 2(b), two (2) of the ten (10) circuit paths to the primary inputs—d.t which inputs to NAND gate 203 and d.f which inputs to NOR gate 204—have a negative state (N) that is inconsistent with the positive state (P) of the primary outputs.

A circuit modification that addresses the inconsistency is two fold. First, the mismatched circuit path is changed to connect to the primary inputs' conjugate signal. Second, an inverter is added to that circuit path. By way of example, in FIG. 2(c), the original connection of primary input d.t to NAND gate 203 was modified to a connection to primary input d.f through an inverter 206. Similarly, the original connection of primary input d.f. to NOR gate 204 is modified to a connection to primary input d.t through an inverter 208. The resulting circuit is shown collectively by 210. By these modifications, circuit 210 performs the same operations as circuit 202, but the state of the primary inputs is consistent with the state of the primary outputs.

Circuit 210 uses both negative logic and positive logic to implement the dual-rail circuit. This differs faun prior null convention techniques, which were limited to the use of positive logic (i.e., the use of positive gates or negative gates followed by inventors). Since gates that implement negative logic are faster than gates used to implement positive logic, the combination of negative and positive logic in this embodiment is faster than dual-rail circuits that were limited to positive logic.

Once modified, completion detection circuitry is added to the primary outputs of the circuit. FIG. 2(d) shows a completion detection circuit 212 being added to the primary outputs of circuit 210 from FIG. 2(c). The particular completion detection implementation shown in FIG. 2(d) is an optimized tree in which each set of companion signals for each primary output is input to an NAND gate, and the outputs of the individual NAND gates are input to another NAND gate that outputs the completion detection signal. Other completion detection implementations, such as a logical tree implementations, could also be used.

Referring now to FIGS. 3(a)-3(c), another example of the conversion of a Boolean logic circuit 300 to a dual-rail with completion detection using state designation is shown. The process tracks that as discussed with respect to FIGS. 2(a)-(d). However, this circuit shows another type of inconsistency in the upstream propagation, where designation called for by one signal line is different from a designation called for in another signal line. In circuit 301, y.t and y.f are inconsistent because they are both designated initially as positive P because they are primary outlets, but in tracking back through NAND gate 302 and NOR gate 304 that signal line is designated as negative N. The inconsistency prevents further tracking back on the respective signal lines.

The circuit modification to address the inconsistency is two fold. First, the mismatched circuit path is changed to connect to the inconsistent line's conjugate signal. Second, an inverter is added to that circuit path. By way of example, in FIG. 3(c), the original connection of y.t. to NOR gate 304 was modified to a connection to y.f through an inverter 308. Similarly, the original connection of y.f, to NAND gate 302 was modified to a connection to y.t through an inverter 312.

The above modifications correct the inconsistency. The remainder of the circuit is tracked back to correct any further inconsistencies. The resulting circuit is shown collectively in FIG. 3(c). By these modifications, the circuit in FIG. 3(c) performs the same operations as circuit 301, but the state of the primary inputs is consistent with the state of the primary outputs.

The circuit of FIG. 3(c) uses both negative logic and positive logic to implement the dual-rail circuit. This differs from prior null convention techniques, which were limited to the use of positive logic (i.e., the use of positive gates or negative gates followed by inventors). Since gates that implement negative logic are typically faster than gates used to implement positive logic, the combination of negative and positive logic in this embodiment is faster than dual-rail circuits that were limited to positive logic.

Referring now to FIGS. 4(a)-4(d), another example is shown of a circuit in which inconsistencies arise in the intermediate signaling. FIG. 4(a) illustrates the original single-rail and technology-mapped circuit. FIG. 4(b) illustrates the first step of the transformation, where each gate is replaced by two gates, one producing the positive rail and its dual producing the negative rail of the signal. FIG. 4(b) also illustrates the polarity labeling of every net in the circuit, whereby the polarity gates producing (a.t b.t) and (a.f+b.f) is not only inconsistent, but there is also a polarity choice, i.e. the polarity can be selected to be positive, P, or negative, N, as different paths from the outputs illustrate different polarities. The path from x.t (or x.f) to the inputs of the N P conflict site imposes an N desired polarity (NAND gate), whereas the other path, i.e. from y.t (or accordingly y.f) implies a P desired polarity (AND gate). FIGS. 4(c) and 4(d) show the two possible phase correcting circuits that can arise by assigning the P polarity to the N.P conflict site and the N polarity to the N.P conflict site respectively. The choice as to which conversion is best depends on the depth of the circuit, so as to reduce the number of new components added.

The circuits arrived at by the above techniques may optional) be optimized in whole or in part by with known logic synthesis techniques which do not introduce new hazards. A non-limiting example of such a technique is described in D. S. Kung. *Hazard-non-increasing Gate-level Optimization Algorithms. Proc. International Conf. Computer-Aided Design (ICCAD)*, pages 631-634, 1992, which is incorporated by reference herein in its entirety. Optimization may occur at any point in the conversion process. It may also occur one or more times.

The two conversion methodologies discussed above are conceptually similar but may differ practically. The Shannon's expansion conversion is preferable for early stages of the synthesis flow, in which limited logic synthesis can still be executed on the converted circuits. The technology-mapping conversion is preferable for circuits that have already been mapped and analyzed, in which the designer prefers to introduce as few changes as possible on the core data-path. Nonetheless, both methods can be used in all such contexts.

Logic synthesis and technology-mapping can be performed on dual-rail networks as long as the set of transformations fall into the category of hazard-non-increasing. In Kung, above, a set of transformations that do not introduce new hazards in Boolean networks was presented. They extend the set originally given in S. H. Unger, Asynchronous Sequential Switching Circuits, Wiley-Interscience. John Wiley & Sons. Inc. New York. 1969, and include De Morgan's laws, dual global flow, global flow, tree decomposition, gate replication, collapsing, kernel-factoring and cube-factoring. These transformations cover, among other things, the conventional algebraic optimizations performed during technology-independent logic synthesis.

During technology mapping, the set of transformations applied to the network also usually falls into the previous categories. In particular, technology mappers perform the following transformations:

1. Tree decomposition into 2-input gates,
2. Gate replication of multiple-fanout nodes, and
3. Collapsing several nodes in order to map them to a library gate.

Additionally, pairs of inverters are inserted in the wires to increase the chances of matching better gates in the library. This insertion also maintains the levelization, and hence the monotonicity, of the network. Some advanced technology mappers also incorporate algebraic transformations.

Combinational Logic (CL) with completion detection (CD) per the disclosed embodiments can be implemented in synchronous and asynchronous environments. FIG. 5(a) shows a synchronous environment, which includes flip-flops (FF) 500, clock signal (CLK) 502, a comparator 504, a reset signal 506, combination logic circuit 508, and completion detection circuitry 510. Comparator 504 compares the output of the completion detection circuitry 510 with the clock signal 502 to determine if the circuit can work at a given clock frequency. If the output of a completion detector 510 changes before the clock edge, then data inputs of receiving Hip-Hops have settled before the clock rises and no synchronization fault occurs. If, however, the completion detector 510 transitions after the clock edge, then there are chances that erroneous values have been stored in flip-flops, such that comparator 504 generates an error signal. By way of non-limiting example, the error signal may be used during production test to bin chips according to their performance, or to provide an on-line testing capability, assuming that the system may roll back and repeat the computation cycle or is capable of stretching the clock.

FIG. 5(b) shows the use circuits with completion detection in an asynchronous environment exploiting micropipeline-based architectures, such as in Ivan E. Sutherland, Micropipelines, *Communications of the ACM*, 32(6):720-738, June 1989. For example, they are suitable for desynchronized circuits which are derived from synchronous synthesizable specifications. In the design of FIG. 5(b), the request signals triggering controllers are derived from completion detectors rather than from matched delays.

FIGS. 5(a) and 5(b) show the presence of reset signals which are used to reset the circuitry in circuit clouds CL. In prior art designs that determine completeness detection from intermediate signals in the circuit, the circuit must reach a quiscent state before being reset. As a result, the speed of the circuit is approximately 2*L, where L is the average input/output latency. NULL words (00 code) must be followed by VALID words (01 or 10 codes) for every computation. NULL is required to precharge, "reset" all nodes and it takes approximately the same amount of time, as the NULL words applied at inputs must propagate all the way to the outputs Since the completion detection signal in the example is based only on the primary outputs, the entire circuit does not need to reach a quiscent stable state before being reset. A preferred embodiment of the invention thus includes a "fast" reset methodology by which several different portions of the circuit simultaneously receive the completion detection signal as a reset. The reset phase takes preferably less time to complete, with the goal of the overall circuit speed being slightly over L, or more specifically (1-1 m), in which L accounts for the valid word delay and 1 m L accounts for the NULL or reset delay.

Referring now to FIG. 6, the circuit cloud CL (such as from FIGS. 5(a) and 5(b) is divided into M levels (where M is a positive integer)). Preferably the first level receives the primary inputs and the final (Mth) level generates the primary outputs. The completion detection signal generated from the completion detection circuitry acts as a reset signal which is input to each level beginning at the second level forward. (The first level having preferably been reset by the incoming NULL word.) In the alternative, the first level could be reset by the same reset signal. By applying to reset signal simultaneously to different points of the circuit, it takes less time to reset the entire circuit.

The global reset signal for the circuit cloud CL is also sent upstream of the circuit cloud CL for use in other circuit operations. Delay circuitry is inserted into this branch path so that the resulting signal lags slightly behind the global reset signal. This delay ensures that the global reset signal fully propogates through the circuit cloud CL before the delayed reset signal is sent to the upstream circuits. The upstream circuit receiving the reset signal will, upon reception of the delayed reset signal know that the DATA and NULL phases of the circuit of FIG. 6 have been completed, and that the next DATA word can now be placed at the inputs of the circuit of FIG. 6. This circuit can be a handshaking controller of various types, which will synchronize the circuit of FIG. 6 with an identical circuit or circuits which propagate data to it. If multiple circuits are providing data to the inputs of the circuit of FIG. 6, preferably all of them will have to be synchronized. The amount of the delay is equal to the delay of the "reset" slice, i.e. the delay that a slice requires for all signals to reset, and can be established by connecting in series a sufficient amount of gates mimicking the delay of the reset slice.

Referring now to FIGS. 7(*a*)-(*b*), a circuit is shown in which the circuit cloud CL is separated into two levels, and reset circuitry is added to the second level. In the disclosed embodiment, the reset circuitry is a series of AND gates in which the reset signal is inverted at the input. Other well known reset techniques may also be used.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

For example, although the two transformation approaches disclosed herein were described with respect to dual-rail circuits, the invention is not so limited. It applies equally well to multi-rail (n-rail) signal representations.

We claim:

1. A method of converting a Boolean logic circuit into an asynchronous multi-rail circuit, comprising:
   converting the Boolean logic circuit into a first multi-rail circuit using at least Shannon's expansion;
   technology mapping the first multi-rail circuit into a second multi-rail circuit; and
   adding completion detection circuitry which receives primary outputs of the second multi-rail circuit;
   dividing the second multi-rail circuit into m slices; and
   adding reset circuitry to at least a second slice of said m slices through an mth slice of said m slices, said circuitry being configured to receive a reset signal, such that a reset signal will simultaneously be applied to at least a second through an mth slice of said m slices;
   wherein at least one of the converting, technology mapping, and adding steps is performed by a computer.

2. The method of claim 1, wherein the reset signal is output by the completion detection circuitry.

3. A method of converting a Boolean logic circuit into an asynchronous multi-rail circuit, comprising:
   converting the Boolean logic circuit into a first multi-rail circuit, comprising:
   converting each node in the Boolean logic circuit implementing a function $y_i = f_i(x_1, \ldots, x_n)$, into two nodes in the first multi-rail circuit with functions:

$$y_i^1 = DR(f_i(x_1, \ldots, x_n))$$

$$y_i^f = DR(\bar{f}_i(x_1, \ldots, x_n))$$

wherein:
   DR denotes the transformation of the function into positive unate;
   $x_1 \ldots x_n$ are input signals of the corresponding node in the Boolean logic circuit;
   $f_i$ is a function performed by the corresponding node in the Boolean logic circuit; and
   $y_i$ is an output signal of the corresponding node in the Boolean logic circuit;
   $y_i^t$ and $y_i^f$ are outputs signal of the corresponding first multi-rail circuit,
   changing the input signals of function $f_i$ from $x_i$ to $x^{t;i}$ and $x^{f;i}$, using a recursive application of Shannon's expansion, as follows:

$$DR(0) = 0, DR(1) = 1$$

$$DR(x \times f_x + \bar{x} \times f_{\bar{x}}) = x^t \times DR(f_x) + x^f \times DR(f_{\bar{x}})$$

technology mapping the first multi-rail circuit into a second multi-rail circuit;
   adding completion detection circuitry which receives primary outputs of the second multi-rail circuit;
   at least one of the converting, technology mapping, and adding steps is performed by a computer.

4. The method of claim 3, wherein as a result of said technology mapping, the second multi-rail circuit is a combination of positive logic and negative logic.

5. The method of claim 3, wherein as a result of said adding, the completion detection circuitry receives only the primary outputs of the second multi-rail circuit.

6. The method of claim 3, wherein as a result of said adding, the completion detection circuitry does not receive any intermediate signals from the second multi-rail circuit.

7. The method of claim 3, wherein as a result of said adding, the completion detection circuitry does not receive any primary input signals from the second multi-rail circuit.

8. The method of claim 3, further comprising optimizing the first multi-rail circuit before said technology mapping.

9. The method of claim 3, further comprising optimizing the second multi-rail circuit before said adding.

10. The method of claim 3, further comprising optimizing at least the second multi-rail circuit after said adding.

11. The method of claim 3, further comprising:
    propagating the completion detection signal upstream for use in the second multi-rail circuit;
    adding a delay to the completion detection signal; and
    propagating the delayed completion detection signal upstream of the second multi-rail circuit.

* * * * *